United States Patent
Hung et al.

(10) Patent No.: US 8,755,029 B2
(45) Date of Patent: Jun. 17, 2014

(54) IMMERSION LITHOGRAPHY APPARATUS AND TANK THEREOF

(75) Inventors: Kuo-Yung Hung, Hsinchu (TW); Fan-Gang Tseng, Lugang Township, Changhua County (TW)

(73) Assignee: National Chiao Tung University, Hsinchu (TW)

( * ) Notice: Subject to any disclaimer, the term of this patent is extended or adjusted under 35 U.S.C. 154(b) by 281 days.

(21) Appl. No.: 13/425,753

(22) Filed: Mar. 21, 2012

(65) Prior Publication Data

US 2012/0176588 A1 Jul. 12, 2012

Related U.S. Application Data

(62) Division of application No. 12/400,119, filed on Mar. 9, 2009, now Pat. No. 8,189,175.

(30) Foreign Application Priority Data

Oct. 3, 2008 (TW) ............................... 97138226 A (51) Int. Cl.
*G03B 27/42* (2006.01)
*G03B 27/52* (2006.01)
*G03F 7/20* (2006.01)

(52) U.S. Cl.
CPC .................. *G03F 7/70341* (2013.01)
USPC ............................... 355/53; 355/30

(58) Field of Classification Search
CPC ............ G03F 7/70341; G03F 7/7035
USPC .............. 355/30, 53; 118/429, 713
See application file for complete search history.

(56) References Cited

U.S. PATENT DOCUMENTS

| 4,509,852 A * | 4/1985 | Tabarelli et al. ................ 355/30 |
| 2007/0003839 A1 | 1/2007 | Rabarot et al. |

FOREIGN PATENT DOCUMENTS

| JP | 1-60538 | 4/1989 |
| JP | 5-265220 | 10/1993 |
| JP | 6-125159 | 5/1994 |
| JP | 2002-189300 | 7/2002 |
| JP | 2005-173129 | 6/2005 |
| JP | 2008-26554 | 2/2008 |
| TW | 200411337 | 7/2004 |

(Continued)

OTHER PUBLICATIONS

English translation of abstract of JP2008-26554.

(Continued)

*Primary Examiner* — Hung Henry Nguyen
(74) *Attorney, Agent, or Firm* — McClure, Qualey & Rodack, LLP (57) ABSTRACT

An immersion lithography apparatus including a container, at least a liquid, a platform, a fixture, a roller, a light source, and a filter is provided. The container includes a bottom plate, a plurality of side plates, and a bearing hole penetrated through one of the side plates. The liquid is filled in the container. The platform is immersed in the liquid. The platform includes a pair of axles. The axles are parallel to the bottom plate. One of the axles passes through the bearing hole. The fixture is mounted on the platform for clamping a mask and a wafer. The roller is connected to the axle, passes through the bearing hole, and is operated to rotate the connected axle. The light source generates ultraviolet light to incident on the mask and the wafer. The filter is located between the light source and the fixture.

7 Claims, 4 Drawing Sheets

(56) References Cited

FOREIGN PATENT DOCUMENTS

| | | |
|---|---|---|
| TW | 200811591 | 3/2008 |
| TW | 200814147 | 3/2008 |
| TW | 200834256 | 8/2008 |
| TW | 200834258 | 8/2008 |

OTHER PUBLICATIONS

English translation of abstract of JP2005-173129.
English translation of abstract of JP5-265220.
English translation of abstract of JP6-125159.
English translation of abstract of JP2002-189300.
English translation of claims of JP1-60538.
Beuret, C., et al.; "Microfabrication of 3D Multidirectional Inclined Structures by UV Lithography and Electroplating;" IEEE, 1994, pp. 81-85.
Sato, H., et al.; "A Novel Fabrication of In-Channel 3D Micromesh Structure using Maskless Multi-Angle Exposure and its Microfilter Application;" IEEE, 2003, pp. 223-226.
Yoon, Y.K., et al.; "Integrated Vertical Screen Microfilter System using Inclined SU-8 Structures;" IEEE, 2003, pp. 227-230.
English translation of abstract of TW 200834256.
English translation of abstract of TW 200811591.
English translation of abstract of TW 200814147.
English translation of abstract of TW 200834258.
English translation of abstract of TW 200411337.

* cited by examiner

IMMERSION LITHOGRAPHY APPARATUS AND TANK THEREOF

RELATED APPLICATIONS

This is a divisional application of patent application Ser. No. 12/400,119 filed on Mar. 9, 2009, now U.S. Pat. No. 8,189,175, which was based on, and claims priority from, Taiwan Patent Application No. 97138226, filed on Oct. 3, 2008, the disclosures of which are hereby incorporated by reference herein in their entireties.

BACKGROUND

1. Field of Invention

The present invention relates to an apparatus for semiconductor fabrication. More particularly, the present invention relates to an apparatus for immersion lithography.

2. Description of Related Art

Lithography process is one of the most important processes of semiconductor fabrication. Lithography process uses light to transfer geometric patterns from a mask to a light-sensitive chemical such as photoresist on a substrate of a wafer. A series of chemical treatments then engrave the exposure pattern on the wafer underneath the photoresist layer to form micro-structures or transistors.

Conventionally, a photolithography process is carried out under normal incidence, which means that the principal plane of the photoresist layer to be photo-structured is about perpendicular to the main direction of a light beam. However, it is hard to produce three-dimensional micro-structures with inclined flanks by using the conventional photolithography apparatus.

Therefore, a new apparatus for performing lithography with normal and inclined incidence is needed. The apparatus may control the inclined angle precisely to ensure the inclined flanks of the three-dimensional micro-structures.

SUMMARY

A tank for an immersion lithography apparatus is provided. The tank has a container with a bottom plate and side plates connected to one another, wherein the side plates surround and connect all edges of the bottom plate. At least a bearing hole penetrates through one of the side plates. The container is filled in at least a liquid, wherein a refractive index of the liquid is ranging from about 1.4 to about 1.8.

A platform is located in the container and immersed in the liquid. The platform has a pair of axles fastened separately on opposite sides thereof. The axles are parallel to the bottom plate, and one of the axles passes through the bearing hole. A roller disposed outside the container connects to the axle passing through the bearing hole to rotate the connected axle, and furthermore, to incline the platform accordingly.

During lithography process, a mask and a wafer with a layer of photoresist may be mounted on the platform, which may be inclined by rotating the roller. Therefore, three-dimensional micro-structures with inclined flanks may be formed on the photoresist layer on the wafer after lithographing. Additionally, refraction occurs when light travels from a medium to another, which usually causes a change of direction of the light or a change of incident angle. In an embodiment of this invention, the refractive index of the liquid is similar to or about equal to a refractive index of the photoresist so that the change of the incident angle may be smaller.

The invention provides an immersion lithography apparatus. The immersion lithography apparatus may perform normal and inclined lithography. The immersion lithography apparatus has a light source, a filter, a fixture, a platform, and a container. The fixture clamps at least a mask and a wafer. The light source may generate ultraviolet light incident on the mask and the wafer. The filter is located in a path of the ultraviolet light interposed between the light source and the fixture.

The container has a bottom plate and side plates connected to one another, wherein the side plates surround and connect all edges of the bottom plate. At least a bearing hole penetrated through one of the side plates. A platform is located in the container. The platform has a pair of axles fastened on opposite sides thereof. One of the axles passes through a bearing hole.

A roller disposed outside the container connects to the axle passing through a bearing hole to rotate the axle, and furthermore, to incline the platform accordingly. After lithographing, three-dimensional micro-structures with inclined flanks may be formed on the photoresist layer of the wafer.

The container is filled in at least a liquid, wherein the platform, the fixture, the mask and the wafer may be immersed in the liquid. A refractive index of the liquid is ranging from about 1.4 to about 1.8, which is similar to a refractive index of the photoresist layer on the wafer. Therefore, when light travels from the liquid to the photoresist layer, the change of the incident angle may be smaller.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1A:
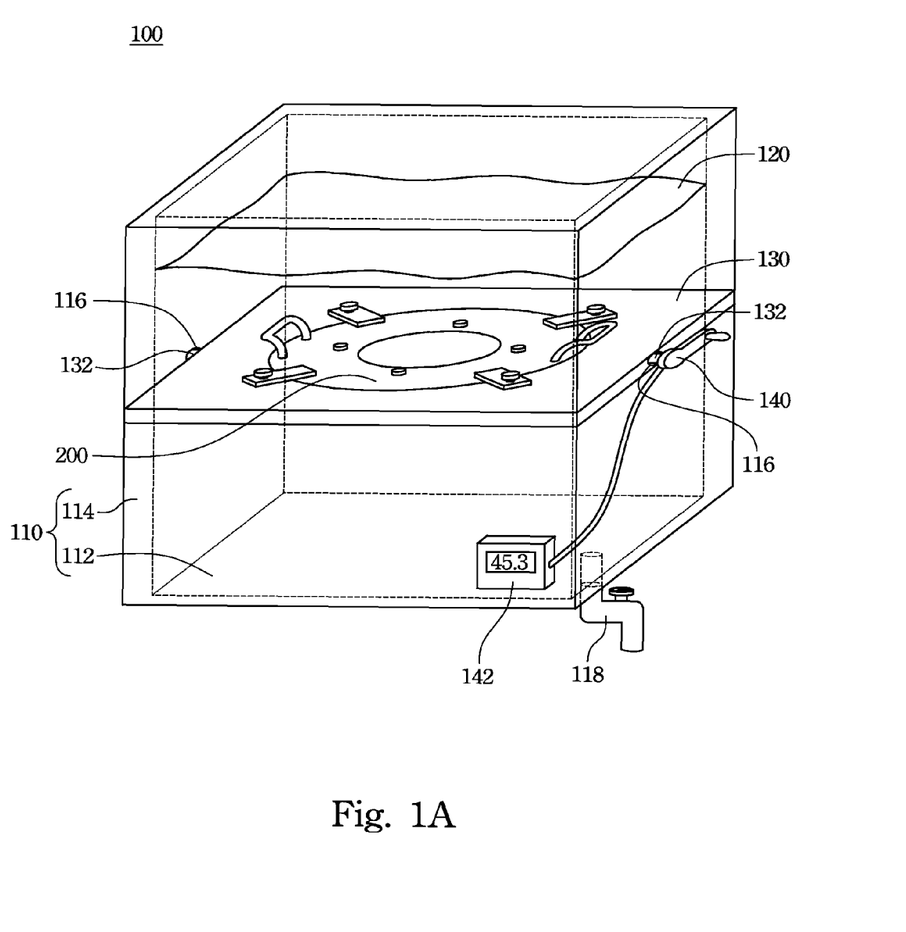
FIG. 1A is a three-dimensional view of a tank according to one embodiment of this invention.
Figure 1B:
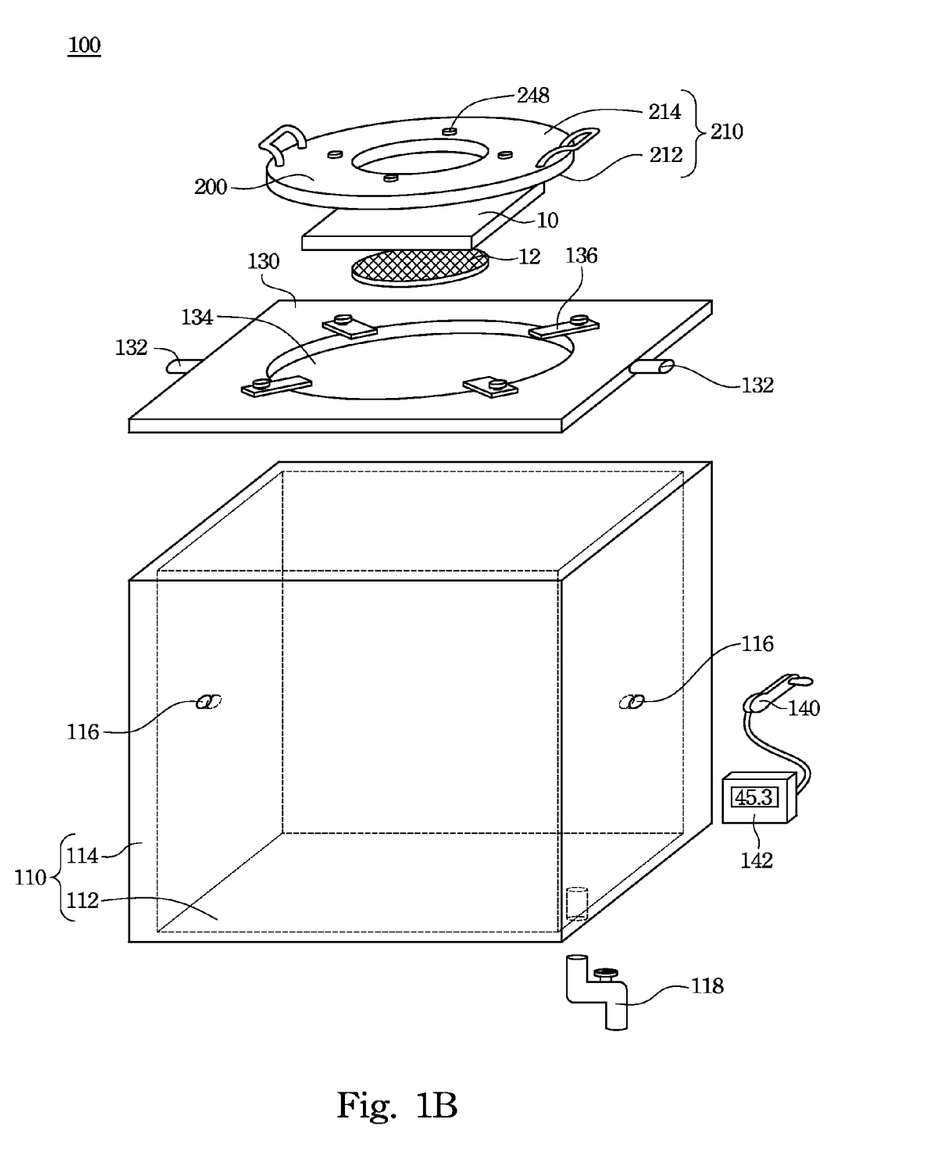
FIG. 1B is an exploded view of the tank shown in FIG. 1A.

Please refer to FIG. 1A and FIG. 1B at the same time. FIG. 1A and FIG. 1B are a three-dimensional view and an exploded view of a tank 100 according to one embodiment of this invention. The tank 100 has a container 110, a platform 130, and a roller 140.

The container 110 has a bottom plate 112 and side plates 114. The side plates 114 connect to one another and the bottom plate 112. In particular, the side plates 114 surround and connect all edges of the bottom plate 112. In the embodiment of this invention, the container 110 is in a form of a pot with an opening for containing at least a liquid 120 like oil, glycerin, etc.

In the embodiment of this invention, the container 110 has a valve 118 disposed on the bottom plate 112 or one of the side plates 114 to regulate flow of the liquid 120. When the valve 118 is turned on, the liquid 120 may flow out of the container 110.

At least a bearing hole 116 penetrates through one of the side plates 114. In the embodiment of this invention, two bearing holes 116 are disposed separately on a pair of opposite side plates 114 of the container 110. The bearing holes 116 are aligned.

A platform 130 is located in the container 110. The platform 130 has an axle 132 fastened on a side thereof. The axle 132 is parallel to the bottom plate 112. In the embodiment of this invention, the platform 130 has two axles 132 separately fastened on a pair of opposite sides thereof, wherein a linking line between the axles 132 may pass through a center of the platform.

When the platform 130 is placed in the container 110, the axle 132 may pass through the bearing hole 116. In the embodiment of this invention, the axles 132 pass through the bearing holes 116 on two opposite side plates 114, and let the platform 130 suspend above the bottom plate 112 inside the container 110.

The platform 130 may be used to mount a mask 10 and a wafer 12. In the embodiment of this invention, the mask 10 and the wafer 12 are clamped on a fixture 200, wherein the fixture 200 may be mounted on the platform 130.

The platform 130 comprises a mount 134 disposed in the middle thereof. The mount 134 penetrates through the platform 130. The shape and the size of the mount 134 are about equal to the shape and the size of the fixture 200 so that the fixture 200 may be mounted by the mount 134. An inner surface of the mount 134 may engage the fixture 200.

The platform 130 further comprises a plurality of fixture clamps 136 disposed surrounding the mount 134 to clamp the fixture 200. In particular, each fixture clamp 136 is fastened on the platform 130 near an edge of the mount 134, wherein part of each fixture clamp 136 protrudes over the edge of the mount 134. When the fixture 200 is mounted by the mount 134, part of each fixture clamp 136 protruded over the edge of the mount 134 may contact the fixture 200.

A roller 140 is disposed near the bearing hole 116 outside the container 110. The roller 140 connects to the axle 132 passing through the bearing hole 116 to rotate the axle 132, and furthermore, to incline the platform 130 accordingly. In the embodiment of this invention, the roller 140 connects to part of the axle 132 protruded out of the bearing hole 116. When using the roller 140 to rotate the axle 132, the platform 130 may be rotated with the axle 132. Therefore, the platform 130 may be inclined accordingly. The structure of the roller 140 may be many. The roller 140 is described here as an example, and not to limit the scope of the invention.

In the embodiment of this invention, the immersion lithography apparatus 100 further comprises a protractor 142 connecting the roller 140 to measure the rotating angle of the roller 140. Since the axle 132 and the platform 130 may rotate with the roller 140, the rotating angle of the roller 140 may be referred to the rotating angle of the axle 132 and the inclined angle of the platform 130. The structure and the operation method for the protractor 142 are many. In an embodiment of this invention, the protractor 142 may measure the rotating angle of the axle 132. In another embodiment of this invention, the axle 132 may have threads, and the protractor 142 may detect the threads to calculate the rotating angle of the axle 132 and the inclined angle of the platform 130. Additionally, the roller 140 may have threads engaged with the threads of the axle 132. The protractor 142 may detect the threads of the roller 140 to calculate the inclined angle of the platform 130.

Figure 2A:
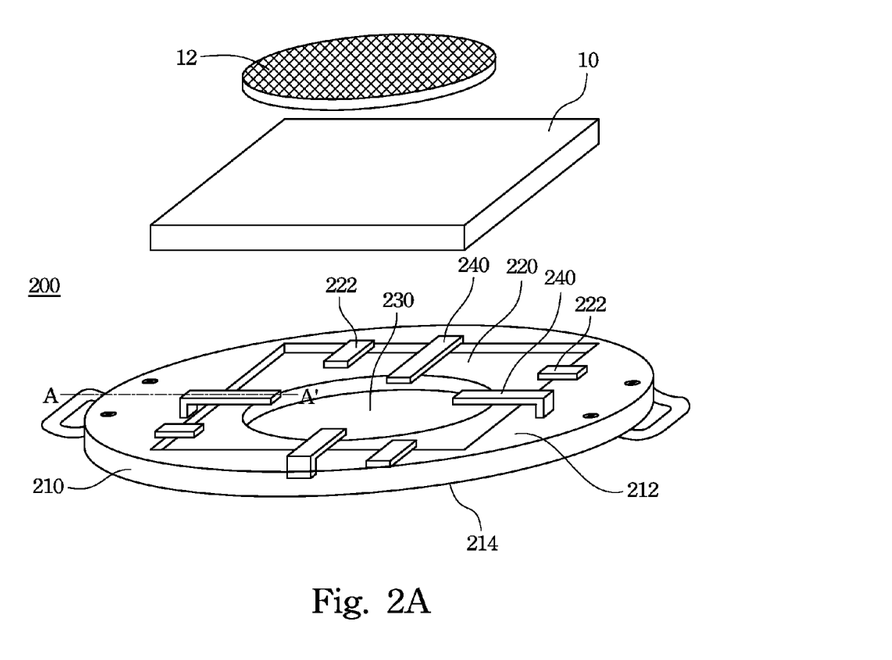
FIG. 2A is a bottom view of the fixture shown in FIG. 1A.
Figure 2B:
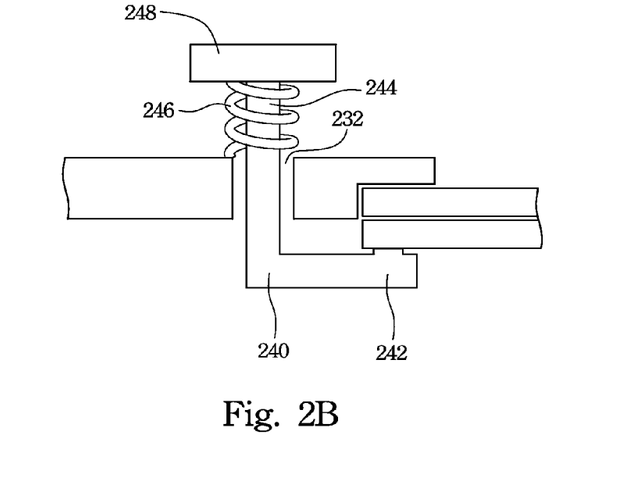
FIG. 2B is a cross sectional view of the fixture shown in FIG. 2A.

Please refer to FIG. 1A to FIG. 2B at the same time. FIG. 2A is a bottom view of the fixture 200. FIG. 2B is a cross sectional view of the fixture 200 according to A-A' line shown in FIG. 2A. The fixture 200 may clamp at least a mask 10 and a wafer 12. The fixture 200 may be mounted on the platform 130 immersed in the liquid 120 when performing the immersion lithography process.

The fixture 200 comprises a base 210 with at least a side surface, a first surface 212 and a second surface 214, wherein the first surface 212 and the second surface 214 are a pair of opposite surfaces of the base 210. The side surface may connect all edges of the first surface 212 and the second surface 214. The shape of the base 210 is not limited such as a circle, a square, a rectangle, or an ellipse. The shape of the base 210 may be similar to the shape of the mount 134 on the platform 130. In the embodiment of this invention, the shape of the base 210 is a circle almost the same as the shape of the mount 134.

A cavity 220 is disposed in the middle of the first surface 212 of the base 210 for containing the mask 10, wherein an opening of the cavity 220 is located in the first surface 212. The shape and the size of the cavity 220 are similar to the mask 10. The depth of the cavity 220 may about equal to or larger than the thickness of the mask 10.

To clamp the mask 10 in the cavity 220, the fixture 200 has a plurality of mask clamps 222 disposed surrounding the cavity 220. Each mask clamp 222 has two ends, wherein one of the ends is fastened on the base 210 and the other end protruded over an edge of the cavity 220 for contacting the mask 10. In the embodiment of this invention, the mask clamps 222 are fastened on the base 210 by screws or latches.

The fixture 200 further has an exposing hole 230 for light generated from the light source 310 passing through to incident on the mask 10 and the wafer 12. The exposing hole 230 may be disposed in the cavity 220 and penetrated through the base 210. The area of the exposing hole 230 may be smaller than the area of the cavity 220. Therefore, the mask 10 may be sandwiched between the bottom of the cavity 220 and the mask clamp 222.

The fixture 200 further comprises structures to clamp the wafer 12 aligned to the mask 10. In particular, the fixture 200 comprises at least a through hole 232, at least a wafer clamp 240, and a spring 246.

The through hole 232 may be disposed on the base 210 near the cavity 220. In the embodiment of this invention, a plurality of through holes 232 surrounds the cavity 220. The through holes 232 penetrate through the base 210 out of the cavity 220, wherein two openings of the through holes 232 are disposed on the first surface 212 and the second surface 214.

The wafer clamp 240 has a first rod 242 and a second rod 244. The first rod 242 extends parallel the first surface 212. The second rod 244 connects to the first rod 242. The second rod 244 may pass through the through hole 232 from the first surface 212 to the second surface 214. The wafer 12 may be sandwiched in the first rod 242 and the base 210.

The shape of the wafer clamp 240 is not limited. In the embodiment of this invention, the wafer clamp 240 is in a shape like a letter L, wherein an included angle between the first rod 242 and the second rod 244 is smaller than 180 degrees. Additionally, the wafer clamp 240 may be in a shape like a letter T, etc.

The spring 246 connected to the second rod 244 of the wafer clamp 240 and the base 210 to provide the first rod 242 a force toward the first surface 212 of the base 210. In particular, the spring 246 may connect the second rod 244 and a region near the opening of the through hole 232 on the second surface 214 of the base 210. Additionally, the spring 246 may connect the second rod 244 and an inner surface of the through hole 232. In the embodiment of this invention, the spring 246 is pivoted on the part of the second rod 244 protruded out of the through hole 232, wherein two ends of the spring 234 connects the second rod 244 and a region near the opening of the through hole 232 on the second surface 214 of the base 210.

Since the wafer clamp 240 is connected to the base 210 via the spring 234, the first rod 242 may rotate around the base 210 on the first surface 212. Therefore, the first rod 242 may rotate to let part thereof protrude over an edge of the cavity 220.

When installing the wafer 12, the first rod 242 may rotate away from the opening of the cavity 220 to allow the wafer 12 pass through. The wafer 12 may be placed on the first surface 212 of the base 210 to be aligned to the mask 10. Then, the first rod 242 may rotate to protrude over an edge of the cavity 220 to let the wafer 12 be sandwiched in the first rod 242 and the base 210. Due to the thickness of the wafer 12, the wafer clamp 240 may move to press the spring 246, which may generate a spring force. The spring 246 may pull the first rod 242 moving toward or against the first surface 212. In the embodiment of this invention, the wafer 12 may be clamped by the first rod 242 and the base 210.

The spring force may be determined by an elastic modulus of the spring 246. To adjust the spring force, the fixture 200 has a knob 248 to change the elastic modulus of the spring 246. The knob 248 connects the spring 246 and is fastened on an end of the second rod 244. In particular, the knob 248 connects an end of the spring 246, and the other end of the spring 246 is fastened on the base 210. When the knob 248 is turned, it may tension the spring 246, and furthermore the elastic modulus of the spring 246 may be changed. In other words, turning the knob 248 to loose or tension the spring 246 may change the elastic modulus of the spring 246.

Figure 3:
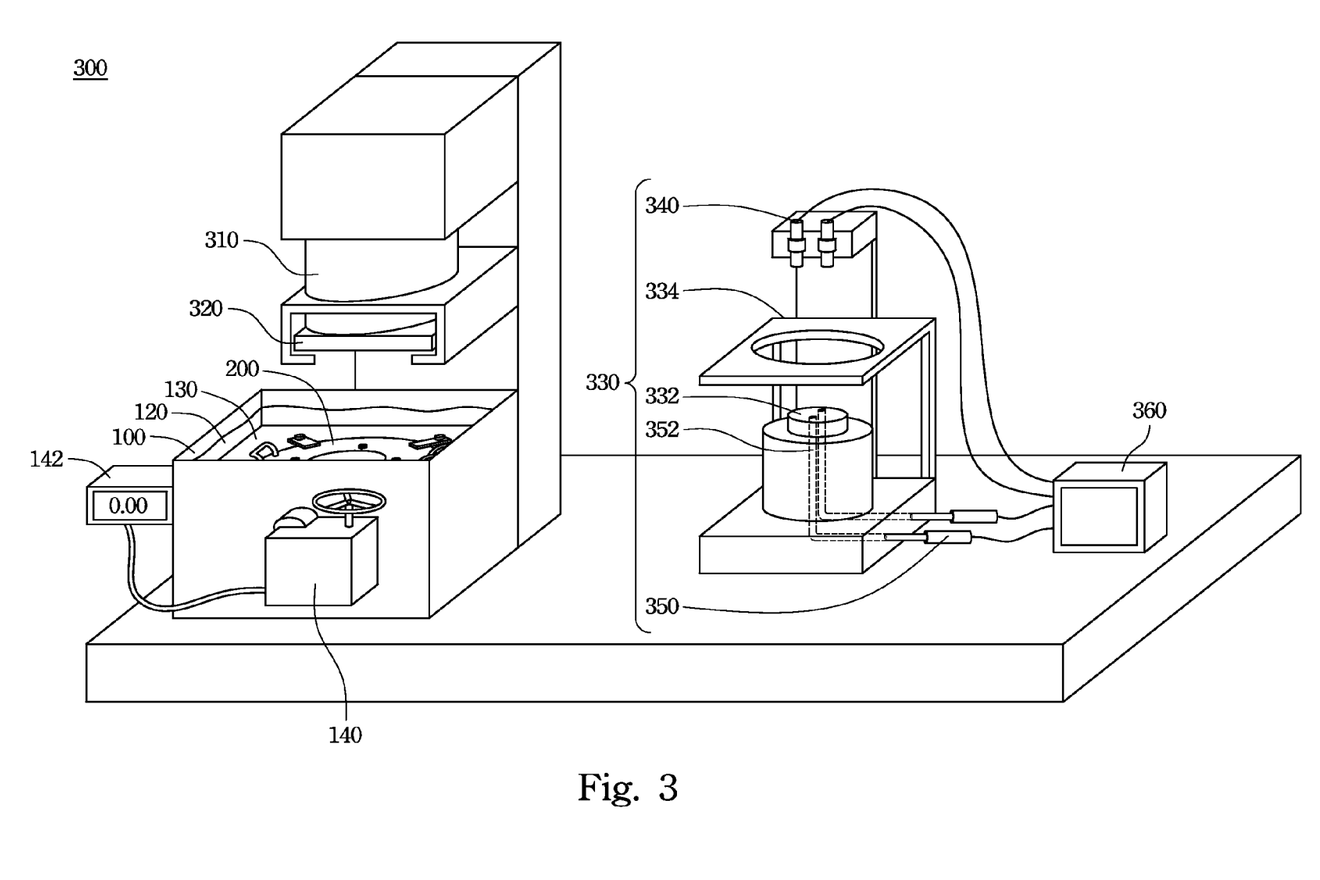
FIG. 3 is a three-dimensional view of an immersion lithography apparatus according to another embodiment of this invention.

Please refer to FIG. 3. FIG. 3 is a three-dimensional view of an immersion lithography apparatus 300 according to another embodiment of this invention. The immersion lithography apparatus 300 may be used to perform immersion inclined lithography process. During the immersion inclined lithography process, the mask 10 and the wafer 12 may be immersed in liquid 120, and the principal plane of the wafer 12 is not perpendicular to the main direction of a light beam. Therefore, the wafer 12 may have three-dimensional micro-structures with inclined flanks after the immersion inclined lithography process.

The immersion lithography apparatus 300 has a light source 310, a filter 320, a tank 100, and a fixture 200. The tank 100 comprises a container 110, a platform 120, and a roller 140. The tank 100 is described above.

Please refer to FIG. 1B and FIG. 3 at the same time. The light source 310 may be disposed suspending above the tank 100 facing the opening of the container 110. The light source 310 may generate ultraviolet light to incident on the mask 10 and the wafer 12 via the exposing hole 230 on the fixture 200. The wavelengths of the ultraviolet light generated from the light source 310 are from about 320 nanometers (referred to as nm) to about 436 nm. In the embodiment of this invention, the distribution of the wavelengths of the ultraviolet light has three peak values, which are about 365 nm, about 405 nm, and about 436 nm.

Diffraction may occur when the ultraviolet light encounters the photoresist layer on the wafer 12, which may expand the area of the exposed region on the photoresist layer. Since the ultraviolet light has different wavelengths, the expanded area of the exposed region may not be controllable. To avoid the above problem, the immersion lithography apparatus 300 has a filter 320 to block part of the ultraviolet light, especially the ultraviolet light with shorter wavelength. The filter 320 is interposed in a path of the ultraviolet light between the light source 310 and the fixture 200.

In the embodiment of this invention, the filter 320 may block the ultraviolet light with shorter wavelengths, which are from about 300 nm to about 370 nm. Therefore, the ultraviolet light reached the photoresist layer on the wafer 12 may have wavelengths from about 370 nm to about 450 nm.

As the above, the distribution of the wavelengths of the ultraviolet light in the embodiment of this invention has three peak values, which are about 365 nm, about 405 nm, and about 436 nm. The filter 320 may block part of the ultraviolet light, and the distribution of the wavelengths of the remaining ultraviolet light has two peak values, which are about 405 nm, and about 436 nm.

The wafer 12 has the photoresist layer on the surface thereof facing the mask 10. Those skilled in the art should know exposing and developing processes and how the mask 10 and the photoresist work in the processes. Different photoresist material may be sensitive to different wavelengths. Take SU-8 type photoresist as an example, the SU-8 type photoresist is sensitive to the ultraviolet light with wavelengths about 405 nm and is insensitive to the ultraviolet light wavelengths about 436 nm. In the embodiment of this invention, the photoresist layer on the wafer 12 is SU-8. Since the light sensitivity of the photoresist, the distribution of the wavelength of the ultraviolet light causing photoreaction may have one peak value, which is about 405 nm.

Additionally, when light travels from a medium to another, refraction may occur. At the boundary between the media, the wave's phase velocity is changed, usually causing a change of direction. According to Snell's law, the angle of incidence and refraction is equivalent to the opposite ratio of the refraction indexes of the media. When the difference between the refraction indexes of the media is smaller, the angle difference between incidence and refraction is smaller.

During the immersion inclined lithography process, the principle plane of the wafer 12 may not be perpendicular to the main direction of a light beam to form three-dimensional micro-structures with inclined flanks. The ultraviolet light may travel from air, mask 10, etc. to the photoresist layer on the wafer 12. The included angle between the light beam and the wafer 12 may be affected by the refraction indexes of the above media.

For example, the refraction index of air is about 1. A transparent region on the mask 10 made from silicide may have a refraction index about 1.45. In general, refraction indexes of photoresist materials are from about 1.4 to about 1.8, wherein a refraction index of the SU-8 type photoresist is about 1.67. When the included angle between the incident light beam and the mask 10 is about 90 degrees, the angle of refraction is about 43.6 degrees. At the boundary between the mask 10 and the photoresist layer, the included angle between the light beam and the photoresist layer may be 43.6 degrees, and the angle of refraction is about 36.7 degrees. Therefore, the inclined angle of the micro-structure may be limited because the difference of the refractive indexes between the media is large.

To solve the above problem, the immersion lithography apparatus 300 has the liquid 120 to reduce the difference of the refractive indexes between the media. The liquid 120 is filled in the container 110. The platform 130, the fixture 200, the mask 10, and the wafer 12 clamped thereon may be immersed in the liquid 120.

The refractive index of the liquid 120 is similar to the refractive index of the photoresist layer on the wafer 12. In the embodiment of this invention, the refractive index of the liquid 120 is ranging from about 1.4 to about 1.8. In a preferred embodiment, the refractive index of the liquid 120 is ranging from about 1.5 to about 1.7. The difference of the refractive indexes between the liquid 120 and the photoresist layer is small. The liquid 120 is transparent and may not react with the photoresist layer. The liquid 120 may be glycerin or oil. In the embodiment of this invention, the liquid 120 is glycerin, wherein the refractive index of the liquid 120 is equal to the refractive index of the photoresist layer on the wafer 12.

On other hand, the platform 130 of the immersion lithography apparatus 300 may be inclined to let the light beam not perpendicular to the wafer 12. Therefore, the light beam is normal incidence from air to the liquid 120, wherein the angles of incidence and refraction are about the same. The included angle between the mask 10 and the light beam is about equal to the inclined angle of the platform 130. Therefore, the light beam is inclined incidence on the mask 10 and the wafer 12. Since the refractive index of the liquid 120 is similar to the refractive index of the photoresist layer on the wafer 12, the angles of incidence and refraction may be about the same.

In the embodiment of this invention, the immersion lithography apparatus 300 has an aligning device 330 operated for aligning the mask 10 and the wafer 12. The aligning device 330 is disposed next to the immersion lithography apparatus 300.

The aligning device 330 has a pedestal 332 for supporting the wafer 12, and a shelf 334 for supporting the fixture 200. The shelf 334 is suspended above the pedestal 332 and aligns to the pedestal 332. When the fixture 200 is placed on the shelf 334, the wafer 12 on the pedestal 332 may be moved to align to the mask 10 clamped on the fixture 200.

The aligning device 330 has two sets of cameras to capture images of the mask 10 and the wafer 12 from different directions, which may help adjust the alignment of the mask 10 and the wafer 12.

In particular, at least a first camera 340 is disposed suspended above the shelf 334. The first camera 340 aligns to the shelf 334 and the pedestal 332. The first camera 340 may capture images of the mask 10 and the wafer 12, which may be top views of the mask 10 and the wafer 12.

At least a second camera 350 is embedded in the pedestal 332. The second camera 350 may capture images of the mask 10 and the wafer 12, which may be bottom views of the mask 10 and the wafer 12. In the embodiment of this invention, the second camera 350 has an optic fiber 352 embedded in the pedestal 332. The optic fiber 352 has two ends, wherein one of the ends connects the second camera 350 and the other end is exposed on the pedestal 332.

The first camera 340 and the second camera 350 are electrically connected to a monitor 360. The monitor 360 may be operated to display the images captured from the first camera 340 and the second camera 350.

In the foregoing, the platform 130 of the tank 100 may be inclined by the roller 140 to perform the immersion inclined lithography process. The liquid 120 filled in the container 110 has the refraction index similar to the photoresist layer on the wafer 12, which may help reduce the change of the angle due to refraction.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An immersion lithography apparatus, comprising:
a container comprising a bottom plate, a plurality of side plates connected to one another, and a bearing hole penetrated through one of the side plates, wherein the side plates surround and connect all edges of the bottom plate;
at least a liquid filled in the container having a refractive index ranging from about 1.4 to about 1.8;
a platform located in the container and immersed in the liquid, the platform comprising a pair of axles fastened separately on opposite sides thereof, the axles being parallel to the bottom plate and one of the axles being passing through the bearing hole;
a fixture mounted on the platform and immersed in the liquid for clamping at least a mask and a wafer;
a roller disposed outside the container, the roller being connected to the axle passing through the bearing hole and operated to rotate the connected axle to incline the platform;
a light source for generating ultraviolet light to incident on the mask and the wafer; and
a filter located in a path of the ultraviolet light interposed between the light source and the fixture.

2. The immersion lithography apparatus of claim 1, wherein the filter blocks the ultraviolet light having wavelength from about 300 nanometers to about 370 nanometers.

3. The immersion lithography apparatus of claim 1, wherein the fixture comprises:
a base comprising a first surface and a second surface, which are a pair of opposite surfaces of the base;
a cavity disposed in the middle of the first surface for containing the wafer;
an exposing hole disposed in the cavity and penetrated through the base for the ultraviolet light passing through; and
a plurality of first clamps disposed surrounding the cavity, each clamp has two ends, wherein one of the ends is fastened on the base and the other end protruded over an edge of the cavity for contacting the mask.

4. The immersion lithography apparatus of claim 3, wherein the fixture further comprises:
At least a through hole penetrated through the base out of the cavity;
At least a second clamp has a first rod extending parallel to the first surface and a second rod connected to the first rod and passing the through hole from the first surface to the second surface, wherein the wafer is sandwiched in the first rod and the base; and
a spring connected to the second rod and the base.

5. The immersion lithography apparatus of claim 4, wherein the fixture further comprises a knob connected to the spring to tension the spring.

6. The immersion lithography apparatus of claim 1, wherein the refractive index of the liquid is ranging from about 1.5 to about 1.7.

7. The immersion lithography apparatus of claim 1, further comprising an aligning device operated for aligning the mask and the wafer, the aligning device comprising:
a pedestal for supporting the wafer;

a shelf suspended above and aligning to the pedestal for supporting the fixture;
at least a first camera suspended above the shelf and aligning to the shelf and the pedestal for capturing an image of the mask and the wafer; and
at least a second camera embedded in the pedestal and aligning to the shelf and the pedestal for capturing an image of the mask and the wafer.

* * * * *